(12) United States Patent
Park et al.

(10) Patent No.: US 8,320,166 B2
(45) Date of Patent: Nov. 27, 2012

(54) MAGNETIC RANDOM ACCESS MEMORY AND METHOD OF READING DATA FROM THE SAME

(75) Inventors: Wan-jun Park, Seoul (KR); Tae-wan Kim, Yongin-si (KR); Sang-jin Park, Pyeongtaek-si (KR); Dae-jeong Kim, Seoul (KR); Seung-jun Lee, Seoul (KR); Hyung-soon Shin, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 411 days.

(21) Appl. No.: 12/230,855

(22) Filed: Sep. 5, 2008

(65) Prior Publication Data

US 2009/0067233 A1    Mar. 12, 2009

Related U.S. Application Data

(62) Division of application No. 11/025,841, filed on Dec. 30, 2004, now abandoned.

(30) Foreign Application Priority Data

Dec. 30, 2003  (KR) .................. 10-2003-0100617

(51) Int. Cl.
*G11C 11/14* (2006.01)
*G11C 11/15* (2006.01)
*G11C 7/14* (2006.01)

(52) U.S. Cl. ..... 365/158; 365/171; 365/173; 365/210.1; 365/210.14; 365/210.15; 365/209; 365/189.07

(58) Field of Classification Search .................. 365/158, 365/171, 173, 210.1, 210.14, 210.15, 209, 365/189.07
See application file for complete search history.

(56) References Cited

U.S. PATENT DOCUMENTS

| | | | |
|---|---|---|---|
| 5,734,605 | A | 3/1998 | Zhu et al. |
| 5,943,286 | A | 8/1999 | Orita |
| 5,953,248 | A | 9/1999 | Chen et al. |
| 6,055,178 | A | 4/2000 | Naji |
| 6,111,781 | A | 8/2000 | Naji |
| 6,317,376 | B1 | 11/2001 | Tran et al. |
| 6,426,907 | B1 | 7/2002 | Hoenigschmid |

(Continued)

FOREIGN PATENT DOCUMENTS

CN    1383155    12/2002

(Continued)

OTHER PUBLICATIONS

Japanese Office Action dated Jun. 29, 2010 for corresponding Application No. 2005-000004 and English translation thereof.

*Primary Examiner* — J. H. Hur
(74) *Attorney, Agent, or Firm* — Harness, Dickey & Pierce, P.L.C.

(57) ABSTRACT

A magnetic random access memory (MRAM) includes a memory cell having a first transistor and a first magnetic tunneling junction (MTJ) layer, and a reference cell operable as a basis when reading data stored in the memory cell, the reference cell including second and third MTJ layers arranged in parallel to each other, and a second transistor connected in series to each of the second and third MTJ layers, the second transistor having a driving capability corresponding to twice a driving capability of the first transistor of the memory cell.

12 Claims, 7 Drawing Sheets

U.S. PATENT DOCUMENTS

| | | |
|---|---|---|
| 6,445,612 B1 * | 9/2002 | Naji .............................. 365/158 |
| 6,600,690 B1 | 7/2003 | Nahas et al. |
| 6,791,887 B2 * | 9/2004 | Hung et al. .............. 365/189.09 |
| 2002/0172073 A1 | 11/2002 | Hidaka |
| 2003/0103395 A1 | 6/2003 | Ooishi |
| 2003/0223268 A1 | 12/2003 | Tanizaki et al. |
| 2005/0180205 A1 | 8/2005 | Park et al. |

FOREIGN PATENT DOCUMENTS

| | | |
|---|---|---|
| JP | 2003-017665 | 1/2003 |

* cited by examiner

Reference Cell                    Memory Cell

MAGNETIC RANDOM ACCESS MEMORY AND METHOD OF READING DATA FROM THE SAME

CROSS-REFERENCE TO RELATED APPLICATION

The present application is a divisional application based on U.S. patent application Ser. No. 11/025,841, entitled, "MAGNETIC RANDOM ACCESS MEMORY AND METHOD OF READING DATA FROM THE SAME," which was filed on Dec. 30, 2004, now abandoned and which is incorporated by reference herein in its entirety.

BACKGROUND OF THE INVENTION

1. Field of the Invention

The present invention relates to a semiconductor memory device and a method of reading data from the same. More particularly, the present invention relates to a magnetic random access memory (MRAM) having a reference cell that is capable of maintaining a middle resistance between a high resistance and a low resistance of a magnetic tunneling junction (MTJ) layer according to changes in a resistance of the MTJ layer caused by an applied voltage and a method of reading data from the MRAM.

2. Description of the Related Art

A magnetic tunneling junction (MTJ) layer of a memory cell of an MRAM has a resistance that varies according to the direction of magnetization of a free magnetic film. When the direction of magnetization of the free magnetic film is the same as the direction of magnetization of a lower magnetic film formed under a tunneling film, the MTJ layer has a low resistance $R_L$. When the direction of magnetization of the free magnetic film is not the same as the direction of magnetization of the lower magnetic film formed under the tunneling film, the MTJ layer has a high resistance $R_H$. Hereinafter, the high resistance is referred to as a maximum resistance of the MTJ layer, and the low resistance is referred to as a minimum resistance of the MTJ layer.

An MRAM is a memory device that stores data "1" and "0" using the fact that the resistance of the MTJ layer is different according to the state of magnetization of the free magnetic film. Thus, in order to read information recorded in a memory cell, the MRAM includes a reference cell having a resistance $(R_H+R_L)/2$ (hereinafter, referred to as a middle resistance) that corresponds to an average resistance of the high resistance $R_H$ and the low resistance $R_L$ of the MTJ layer. The reference cell includes a transistor and an MTJ layer connected to the transistor. The middle resistance of the reference cell is the resistance of the MTJ layer provided in the reference cell.

Figure 1:
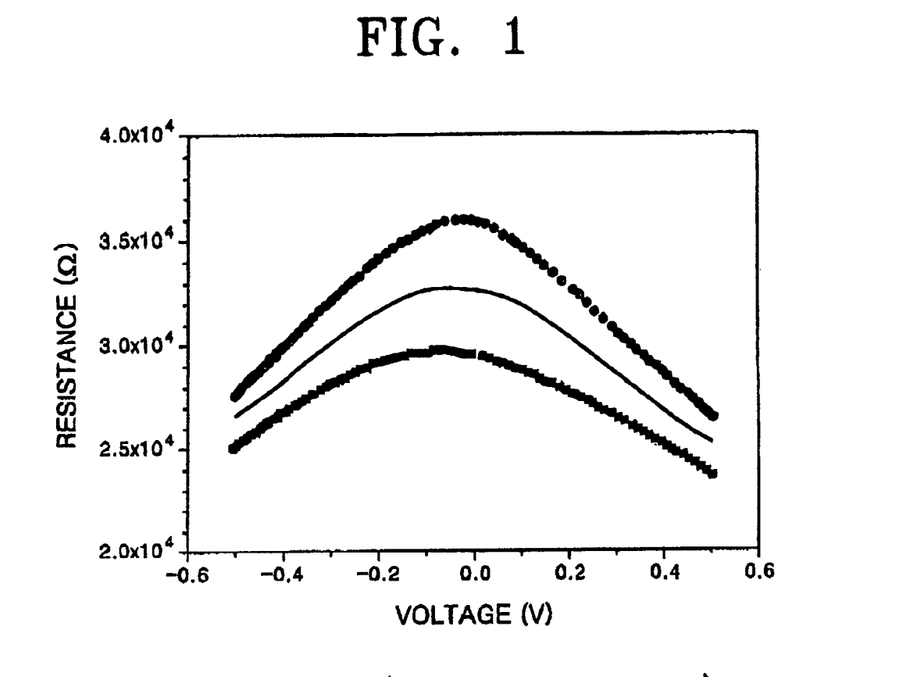
FIG. 1 is a graph of an ideal voltage versus resistance of a magnetic tunneling junction (MTJ) layer of a memory cell of an MRAM and an MTJ layer of a reference cell.

During operation, the resistances $R_H$ and $R_L$ of the MTJ layer vary according to a voltage applied to the MTJ layer. Thus, as shown in FIG. 1, which is a graph of an ideal voltage versus resistance of a magnetic tunneling junction (MTJ) layer of a memory cell of an MRAM and an MTJ layer of a reference cell, the resistance of the MTJ layer of the reference cell of the MRAM, which is represented by a solid line, should be constant at a middle resistance $(R_H+R_L)/2$ between a low resistance $R_L$ (■) and a high resistance $R_H$ (●) of the MTJ layer of the memory cell according to a voltage applied to the reference cell.

However, in a case of a reference cell of a conventional MRAM, the above-described conditions are not satisfied.

Figure 2:
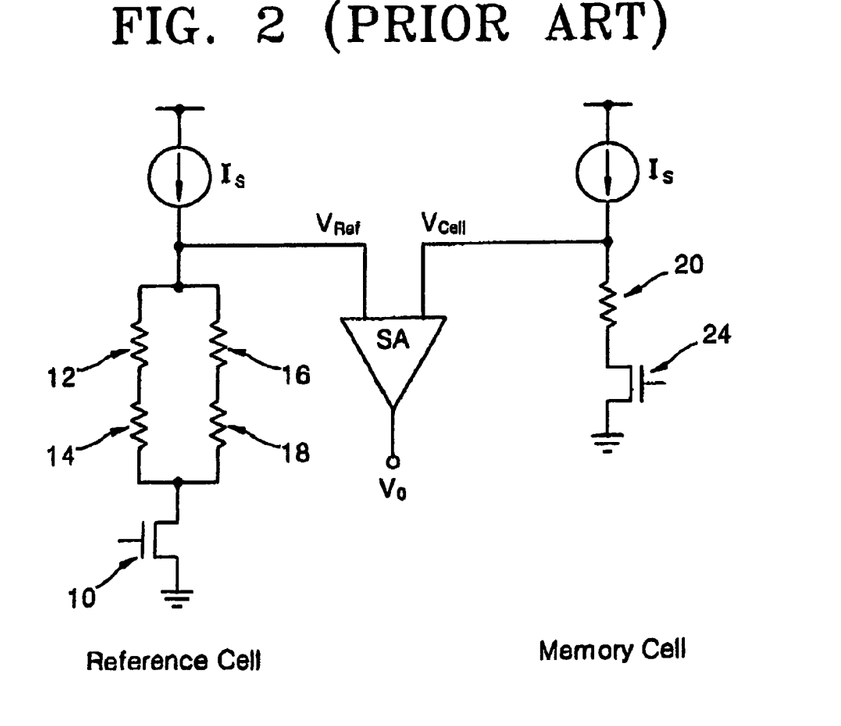
FIGS. 2, 5, and 7 are circuit diagrams of a memory cell and a reference cell of conventional MRAMs.
Figure 3:
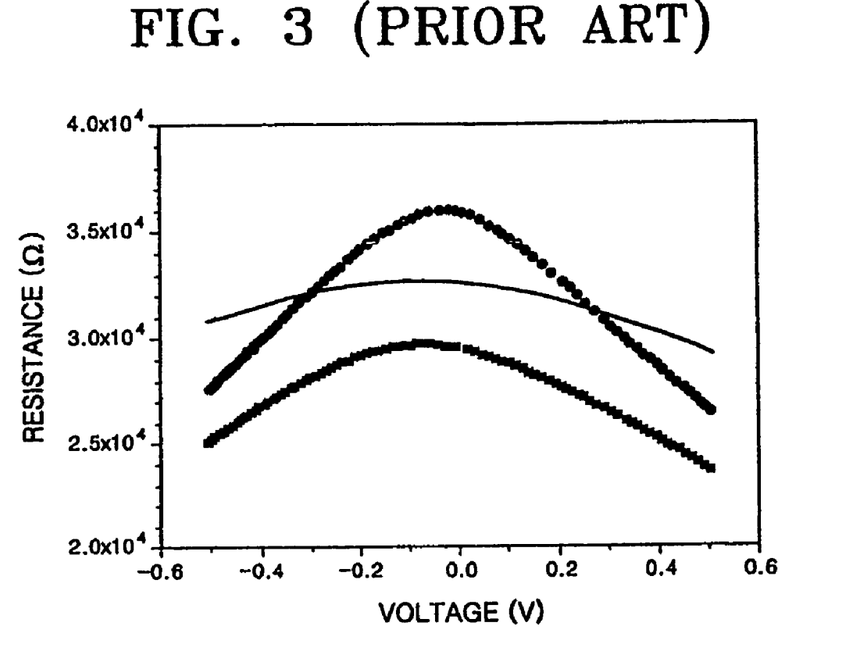
FIG. 3 is a graph of voltage versus resistance of an MTJ layer of a memory cell and an MTJ layer of a reference cell of the conventional MRAM of FIG. 2.
Figure 4:
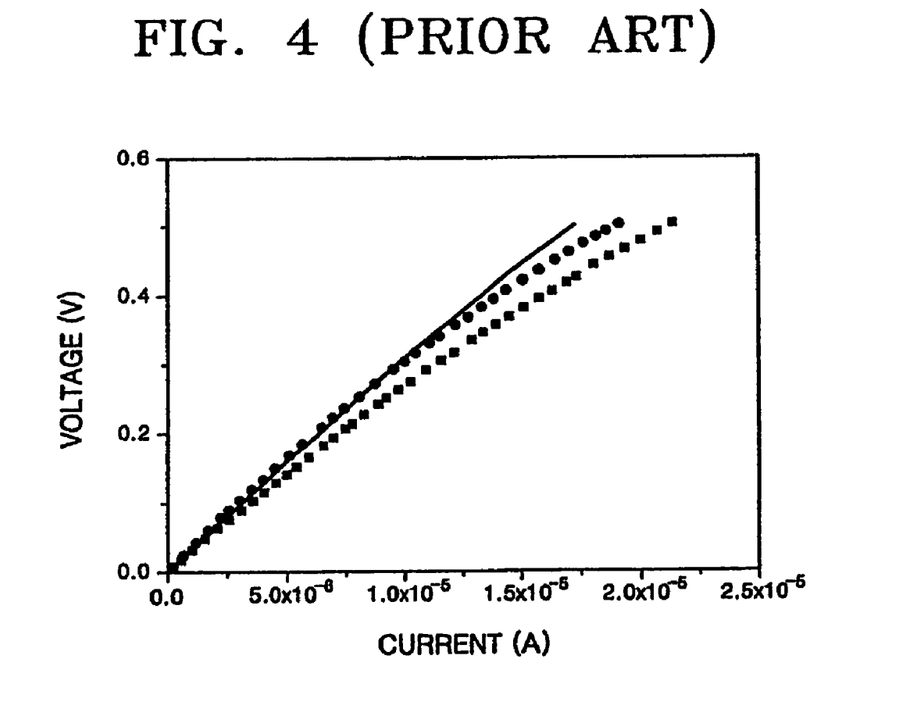
FIG. 4 is a graph of voltage versus current of an MTJ layer of a memory cell and an MTJ layer of a reference cell of the conventional MRAM of FIG. 2.
Figure 5:
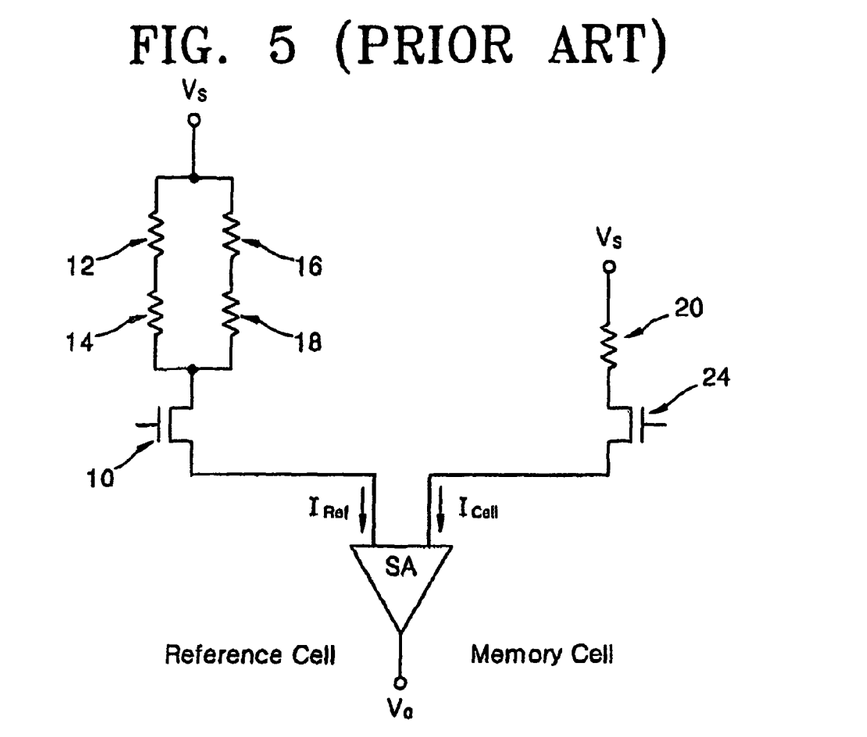
Figure 6:
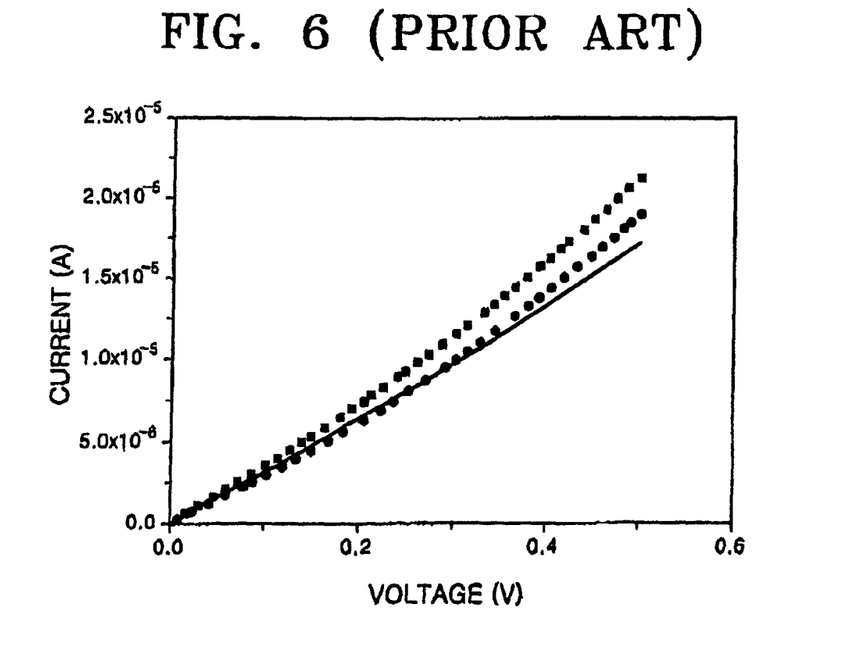
FIG. 6 is a graph of voltage versus current of an MTJ layer of a memory cell and an MTJ layer of a reference cell of the conventional MRAM of FIG. 5.
Figure 7:
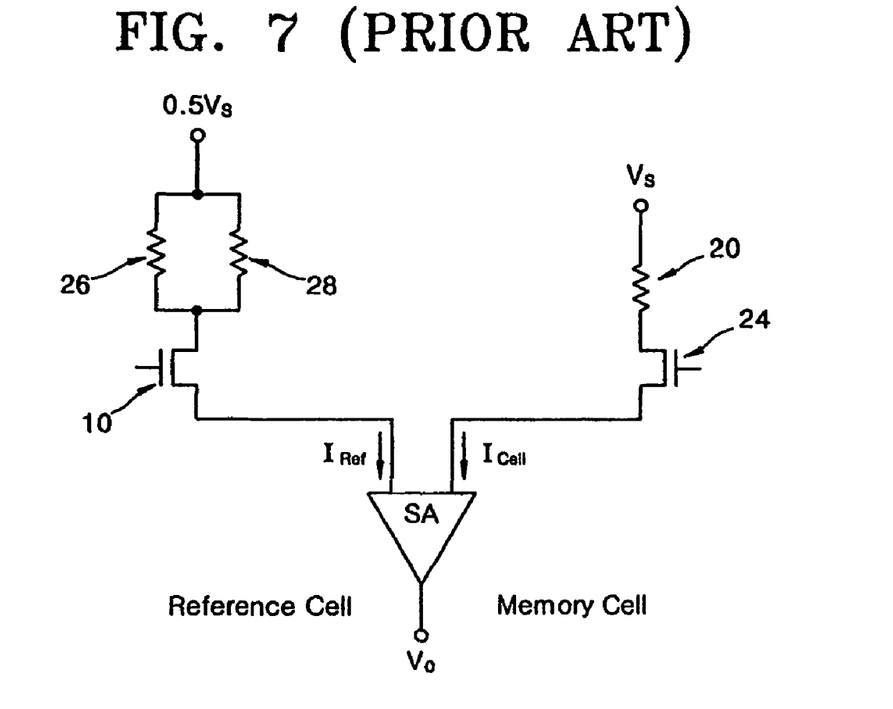

FIGS. 2, 5, and 7 are circuit diagrams of a memory cell and a reference cell of a conventional MRAM. FIG. 3 is a graph of voltage versus resistance of an MTJ layer of a memory cell and an MTJ layer of a reference cell of the conventional MRAM of FIG. 2. FIG. 4 is a graph of voltage versus current of an MTJ layer of a memory cell and an MTJ layer of a reference cell of the conventional MRAM of FIG. 2. FIG. 6 is a graph of voltage versus current of an MTJ layer of a memory cell and an MTJ layer of a reference cell of the conventional MRAM of FIG. 5.

For example, the reference cell of the conventional MRAM includes first through fourth MTJ layers 12, 14, 16, and 18 and a first transistor 10, as shown on the left side of a sensor amplifier (SA) in FIG. 2. A memory cell including a fifth MTJ layer 20 and a second transistor 24 is shown on the right side of the sensor amplifier SA in FIG. 2.

In such a device, a resistance is measured from an MTJ layer. Accordingly, in FIG. 2, each of the MTJ layers is indicated by a resistance. Hereinafter, MTJ layers in all circuits are indicated by a resistance.

The first and second MTJ layers 12 and 14 have a high resistance $R_H$ and a low resistance $R_L$, respectively. The third and fourth MTJ layers 16 and 18 have a low resistance $R_L$ and a high resistance $R_H$, respectively. The first and second MTJ layers 12 and 14 are connected in series to each other. The third and fourth MTJ layers 16 and 18 are also connected in series to each other. The first and second MTJ layers 12 and 14 and the third and fourth MTJ layers 16 and 18 are connected in parallel to each other. The first transistor 10 is connected between the second and fourth MTJ layers 14 and 18.

Referring to FIG. 2, a current $I_s$ is supplied to both the reference cell and the memory cell. $V_{Ref}$ and $V_{Cell}$ are a voltage measured in the reference cell and a voltage measured in the memory cell, respectively. A conventional MRAM including the reference cell and the memory cell shown in FIG. 2 reads information stored in the memory cell using a difference between the voltages $V_{Ref}$ and $V_{Cell}$.

However, the current $I_s$ supplied to the reference cell from a current source is divided by two such that a current $I_s/2$ is supplied to each of the first and second MTJ layers 12 and 14 and the third and fourth MTJ layers 16 and 18. As such, the voltage applied to each MTJ layer of the reference cell is about half of the voltage applied to the fifth MTJ layer 20 of the memory cell. For this reason, it is difficult to maintain the equivalent resistance of the reference cell at $(R_H+R_L)/2$, as shown in FIG. 3.

Since the equivalent resistance of the reference cell is not maintained at $(R_H+R_L)/2$, the voltage $V_{Ref}$ measured in the reference cell has characteristics shown in FIG. 4.

More specifically, in FIG. 4, symbol ● is a graph showing a voltage $V_{Cell}$,H measured when the fifth MTJ layer 20 has a high resistance, symbol ■ is a graph showing a voltage $V_{Cell}$,L measured when the fifth MTJ layer 20 has a low resistance, and a solid line is a graph showing a voltage $V_{Ref}$ measured in the reference cell. Referring to the graphs in FIG. 4, the voltage $V_{Ref}$ measured in the reference cell is different from $(V_{Cell},H+V_{Cell},L)/2$.

Since the voltage measured in the reference cell does not have a middle value between a maximum voltage and a minimum voltage measured in the memory cell, in a case of the conventional MRAM having the memory cell and the reference cell of FIG. 2, a sensing margin is reduced such that noise or malfunction may occur.

The reference cell and the memory cell of FIG. 5 are the same as the reference cell and the memory cell of FIG. 2 in constitution, but a voltage $V_s$ instead of a current is applied to the reference cell and the memory cell. Thus, an MRAM having the reference cell and the memory cell of FIG. 5 reads information recorded in the memory cell using a difference between a current $I_{Ref}$ measured in the reference cell and a current $I_{Cell}$ measured in the memory cell. However, in the case of the MRAM of FIG. 5, like the MRAM of FIG. 2, voltages applied to each of the first through fourth MTJ layers 12, 14, 16, and 18 of the reference cell are about half of a voltage applied to the fifth MTJ layer 20 of the memory cell. Therefore, it is difficult to maintain the equivalent resistance of the reference cell at $(R_H+R_L)/2$, and it is also difficult to maintain the current $I_{Ref}$ measured in the reference cell at a middle value $(I_{Cell},H+I_{Cell},L)/2$ between a maximum current $I_{Cell},H$ and a minimum current $I_{Cell},L$ measured in the memory cell.

Specifically, referring to FIG. 6, symbol ● is a graph showing maximum currents $I_{Cell},H$ measured in the memory cell, symbol ■ is a graph showing minimum currents $I_{Cell},L$ measured in the memory cell, and a solid line is a graph showing a current $I_{Ref}$ measured in the reference cell. Referring to the graphs in FIG. 6, the current $I_{Ref}$ measured in the reference cell is very different from a middle value $(I_{Cell},H+I_{Cell},L)/2$ between the maximum currents $I_{Cell},H$ and the minimum currents $I_{Cell},L$ measured in the memory cell according to an applied voltage.

Thus, in case of the MRAM having the memory cell and the reference cell of FIG. 5, like the MRAM of FIG. 2, a sensing margin is reduced such that noise may occur.

FIG. 7 shows an MRAM having a reference cell including sixth and seventh MTJ layers 26 and 28, and the first transistor 10. The sixth MTJ layer 26 has a low resistance $R_L$, and the seventh MTJ layer 28 has a resistance $R_H$ higher than the resistance of the sixth MTJ layer 26. The sixth and seventh MTJ layers 26 and 28 are connected in parallel to each other, and the first transistor 10 is connected between the sixth and seventh MTJ layers 26 and 28. Here, a voltage 0.5 $V_s$, which corresponds to ½ of a voltage $V_s$ supplied to the memory cell, is applied to the reference cell.

In the MRAM shown in FIG. 7, like in the MRAM of FIG. 5, since the voltage $0.5V_s$ applied to the two MTJ layers 26 and 28 of the reference cell is about half of the voltage $V_s$ applied to the fifth MTJ layer 20 of the memory cell, it is difficult to maintain the equivalent resistance of the reference cell at $(R_H+R_L)/2$. Thus, the current $I_{Ref}$ measured in the reference cell of the MRAM of FIG. 7 cannot be maintained at a middle value $(I_{Cell},H+I_{Cell},L)/2$ between the maximum current $I_{Cell},H$ and the minimum current $I_{Cell},L$ measured in the memory cell, as shown in FIG. 6. For this reason, in the case of the MRAM of FIG. 7, a sensing margin is reduced such that noise or malfunction may occur.

SUMMARY OF THE INVENTION

The present invention is therefore directed to a magnetic random access memory (MRAM) and a method of reading data from the MRAM, which substantially overcome one or more of the problems due to the limitations and disadvantages of the related art.

It is a feature of an embodiment of the present invention to provide a magnetic random access memory (MRAM) capable of maintaining the equivalent resistance of a magnetic tunneling junction (MTJ) layer of a reference cell at a middle value $(R_H+R_L)/2$ between a maximum resistance $R_H$ and a minimum resistance $R_L$ of the MTJ layer of a memory cell even though an applied voltage varies.

It is another feature of an embodiment of the present invention to provide a method of reading data from the MRAM.

At least one of the above and other features and advantages of the present invention may be realized by providing a magnetic random access memory (MRAM), including a memory cell having one transistor and one magnetic tunneling junction (MTJ) layer, and a reference cell that is operable for use as a basis when reading data stored in the memory cell, wherein the reference cell includes first and second MTJ layers provided in parallel to each other, and first and second transistors provided in parallel to each other, the first and second transistors being respectively connected in series to the first and second MTJ layers.

At least one of the above and other features and advantages of the present invention may be realized by providing a magnetic random access memory (MRAM), including a memory cell having one transistor and one magnetic tunneling junction (MTJ) layer, and a reference cell that is operable for use as a basis when reading data stored in the memory cell, wherein the reference cell includes first and second MTJ layers provided in parallel to each other, and a first transistor connected in series to the first and second MTJ layers, and wherein a driving capability of the first transistor of the reference cell is twice a driving capability of the transistor of the memory cell.

In either of the above devices, one of the first and second MTJ layers of the reference cell may have a maximum resistance of the MTJ layer of the memory cell, and the other of the first and second MTJ layers of the reference cell may have a minimum resistance of the MTJ layer of the memory cell.

At least one of the above and other features and advantages of the present invention may be realized by providing a method of reading data from a magnetic random access memory (MRAM) including a memory cell having one transistor and one magnetic tunneling junction (MTJ) layer, and a reference cell having first and second MTJ layers provided in parallel to each other and first and second transistors provided in parallel to each other, the first and second transistors of the reference cell being connected in series to the first and second MTJ layers, respectively, the method including applying a read current $I_s$ to the memory cell, and applying a current $2 I_s$ corresponding to twice the read current to the reference cell.

At least one of the above and other features and advantages of the present invention may be realized by providing a method of reading data from a magnetic random access memory (MRAM) including a memory cell having one transistor and one magnetic tunneling junction (MTJ) layer, and a reference cell having first and second MTJ layers connected in parallel to each other and a first transistor which is connected in series to the first and second MTJ layers, the first transistor having a driving capability corresponding to twice a driving capability of the transistor of the memory cell, the method including applying a read current $I_s$ to the memory cell, and applying a current $2 I_s$ corresponding to twice the read current to the reference cell.

According to an embodiment of the present invention, the equivalent resistance of the MTJ layer of the reference cell is maintained at the middle value between the maximum resistance and the minimum resistance of the MTJ layer of the memory cell even though the applied voltage varies, thereby sufficiently providing a sensing margin and preventing a malfunction caused by noise.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION OF THE INVENTION

Korean Patent Application No. 10-2003-0100617, filed on Dec. 30, 2003, in the Korean Intellectual Property Office, and entitled: "Magnetic Random Access Memory and Method of Reading Data from the Same," is incorporated by reference herein in its entirety.

The present invention will now be described more fully hereinafter with reference to the accompanying drawings, in which exemplary embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

Figure 8:
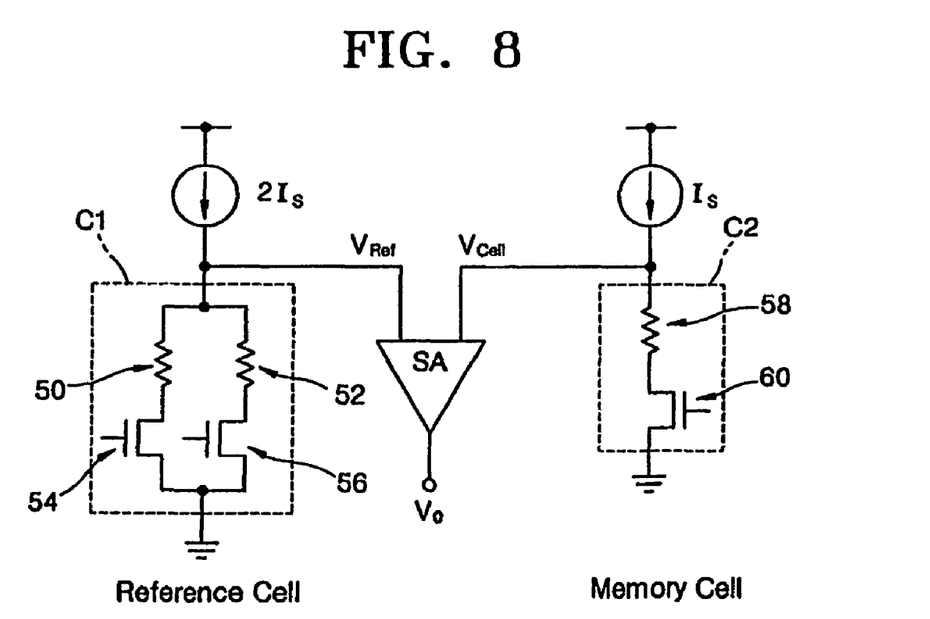
FIG. 8 is a circuit diagram of a memory cell and a reference cell of an MRAM according to an embodiment of the present invention.

FIG. 8 is a circuit diagram of a memory cell and a reference cell of an MRAM according to an embodiment of the present invention.

FIG. 8 shows a circuit constitution for a memory cell C2 and a reference cell C1 corresponding to the memory cell C2 of the MRAM according to an embodiment of the present invention. The reference cell is operable for use as a basis when reading data stored in the memory cell. Referring to FIG. 8, the reference cell C1 includes first and second MTJ layers 50 and 52 and first and second transistors 54 and 56. The memory cell C2 includes a third MTJ layer 58 and a third transistor 60. The first MTJ layer 50 has a low resistance and may be the same resistance as a minimum resistance of the third MTJ layer 58 of the memory cell C2. The second MTJ layer 52 of the reference cell C1 has a resistance higher than the resistance of the first MTJ layer 50. The resistance of the second MTJ layer 52 may be the same as a maximum resistance of the third MTJ layer 58. Alternatively, the above-described relation between the first and second MTJ layers 50 and 52 of the reference cell C1 may be reversed. The first and second MTJ layers 50 and 52 of the reference cell C1 are connected in parallel to each other, and the first and second transistors 54 and 56 of the reference cell C1 are connected in parallel to each other. The first MTJ layer 50 and the first transistor 54 are connected in series to each other. The second MTJ layer 52 and the second transistor 56 are also connected in series to each other. The first and second transistors 54 and 56 of the reference cell C1 may be the same as the third transistor 60 of the memory cell C2.

During a read operation, a predetermined read current $I_s$ is applied to the memory cell C2 from a current source and, simultaneously, a current $2\,I_s$, which corresponds to twice the read current $I_s$, is applied to the reference cell C1. Voltages $V_{Ref}$ and $V_{Cell}$ measured in the reference cell C1 and the memory cell C2, respectively, are compared with each other to read data stored in the memory cell C2.

Figure 9:
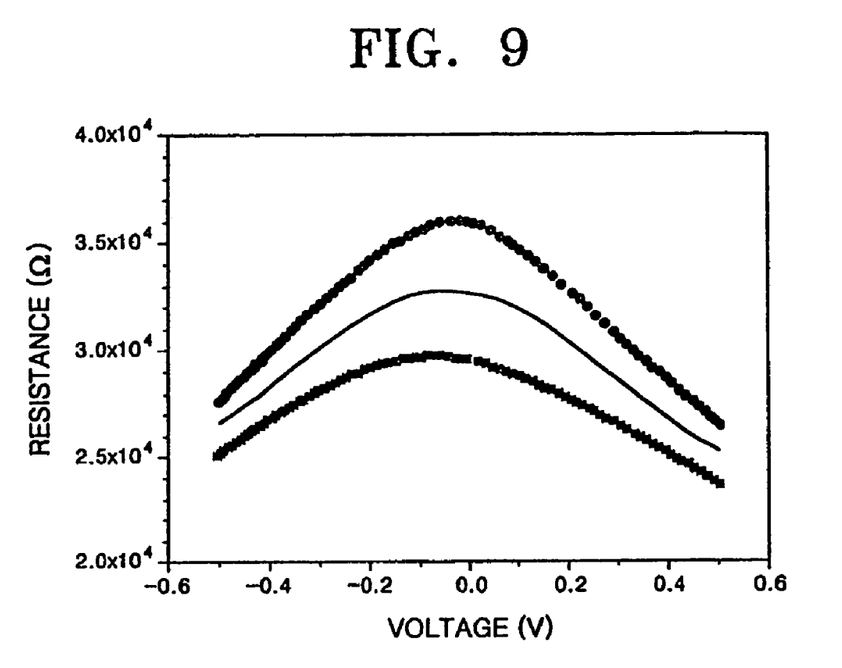
FIG. 9 is a graph of voltage versus resistance of an MTJ layer of a memory cell and an MTJ layer of a reference cell of the MRAM of FIG. 8.

In this case, since the first and second MTJ layers 50 and 52 are connected in parallel to the reference cell C1 as described above, the current $2\,I_s$ applied to the reference cell C1 is divided so that the same current as the current $I_s$ applied to the memory cell C2 is applied to each of the first and second MTJ layers 50 and 52. In addition, since the first and second transistors 54 and 56, which are the same as a pass transistor of the memory cell C2, i.e., the third transistor 60, are respectively connected in series to the first and second MTJ layers 50 and 52 of the reference cell C1, the voltage applied to the first and second MTJ layers 50 and 52 of the reference cell C1 is substantially similar to the voltage applied to the third MTJ layer 58 of the memory cell C2. Thus, the equivalent resistance of the reference cell C1 may be maintained at a middle value between a maximum resistance $R_H$ and a minimum resistance $R_L$ of the third MTJ layer 58 of the memory cell C1 even though an applied voltage varies. FIG. 9 shows this result in the reference cell C1.

FIG. 9 is a graph of voltage versus resistance of the MTJ layer of the memory cell and the MTJ layers of the reference cell of the MRAM of FIG. 8.

In FIG. 9, symbol ● plots changes in the maximum resistance of the third MTJ layer 58 of the memory cell C2 according to an applied voltage, and symbol ■ plots changes in the minimum resistance of the third MTJ layer 58. A solid line shows changes in the resistance measured in the reference cell C1.

Referring to FIG. 9, the resistance measured in the reference cell C1 is maintained at a middle value between the maximum resistance and the minimum resistance of the third MTJ layer 58 of the memory cell C2, even though the applied voltage varies.

Figure 10:
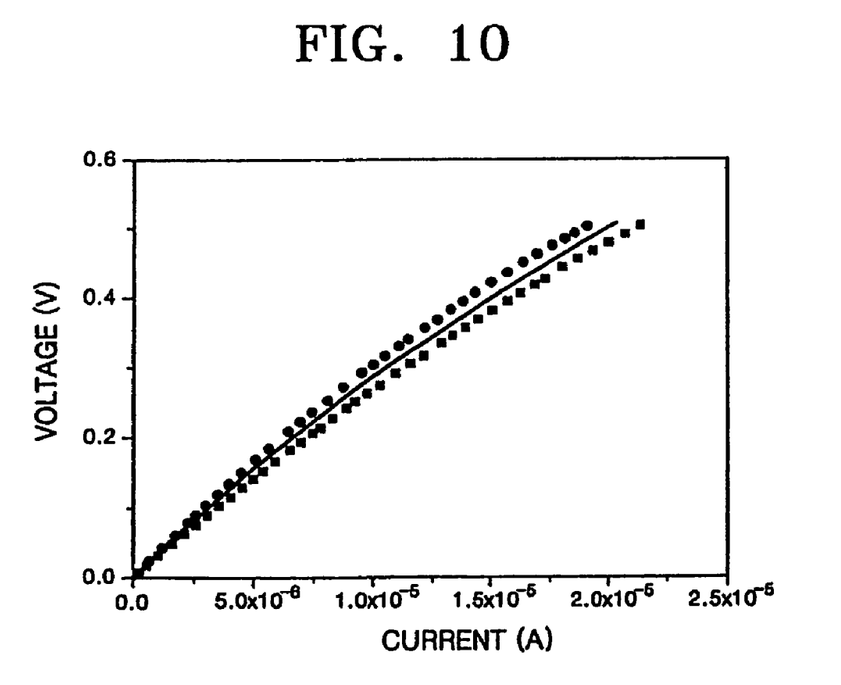
FIG. 10 is a graph of voltage versus current of an MTJ layer of a memory cell and an MTJ layer of a reference cell of the MRAM of FIG. 8.

Since the resistance of the reference cell C1 is maintained at the middle value between the maximum resistance and the minimum resistance of the memory cell C2, the voltage $V_{Ref}$ of the reference cell C1 can be constantly maintained at a middle value $(V_{Cell},H+V_{Cell},L)/2$ between the maximum voltage $V_{Cell},H$ and the minimum voltage $V_{Cell},L$ of the memory cell C2 even though the applied voltage varies. FIG. 10 shows this result.

FIG. 10 is a graph of voltage versus current of the MTJ layer of the memory cell and the MTJ layers of the reference cell of the MRAM of FIG. 8.

In FIG. 10, symbol ● plots changes in the maximum resistance $V_{Cell},H$ of the memory cell C2 according to an applied voltage, and symbol ■ plots changes in the minimum resistance $V_{Cell},L$ of the memory cell C2 according to the applied voltage. A solid line shows changes in the resistance measured in the reference cell C1 according to the applied voltage.

Referring to FIG. 10, it may be seen that the voltage of the reference cell C1 is a middle value between the maximum voltage $V_{Cell},H$ and the minimum voltage $V_{Cell},L$ of the memory cell C2 at any applied voltage. Based on this result, by using an MRAM according to an embodiment of the present invention, a sufficient sensing margin can be obtained so that data can be stably read without malfunction.

Alternatively, a reference cell according to an alternative embodiment of the present invention (hereinafter "the alternative reference cell") may substitute one transistor for the first and second transistors 54 and 56 in the reference cell C1 of FIG. 8. In this case, the one transistor is a pass transistor. Since a current that passes through two MTJ layers 50 and 52 connected in parallel passes through the one substituted transistor, the driving capability of the one substituted transistor may be twice the driving capability of the third transistor 60 in the memory cell C2.

In a case of an MRAM including the alternative reference cell, a process of reading data from the memory cell C2 is the same as a process to be performed by the MRAM including the reference cell C1.

As a further alternative, the position of each MTJ layer and the position of each transistor may be reversed from the reference cell C1 of FIG. 8.

Figure 11:
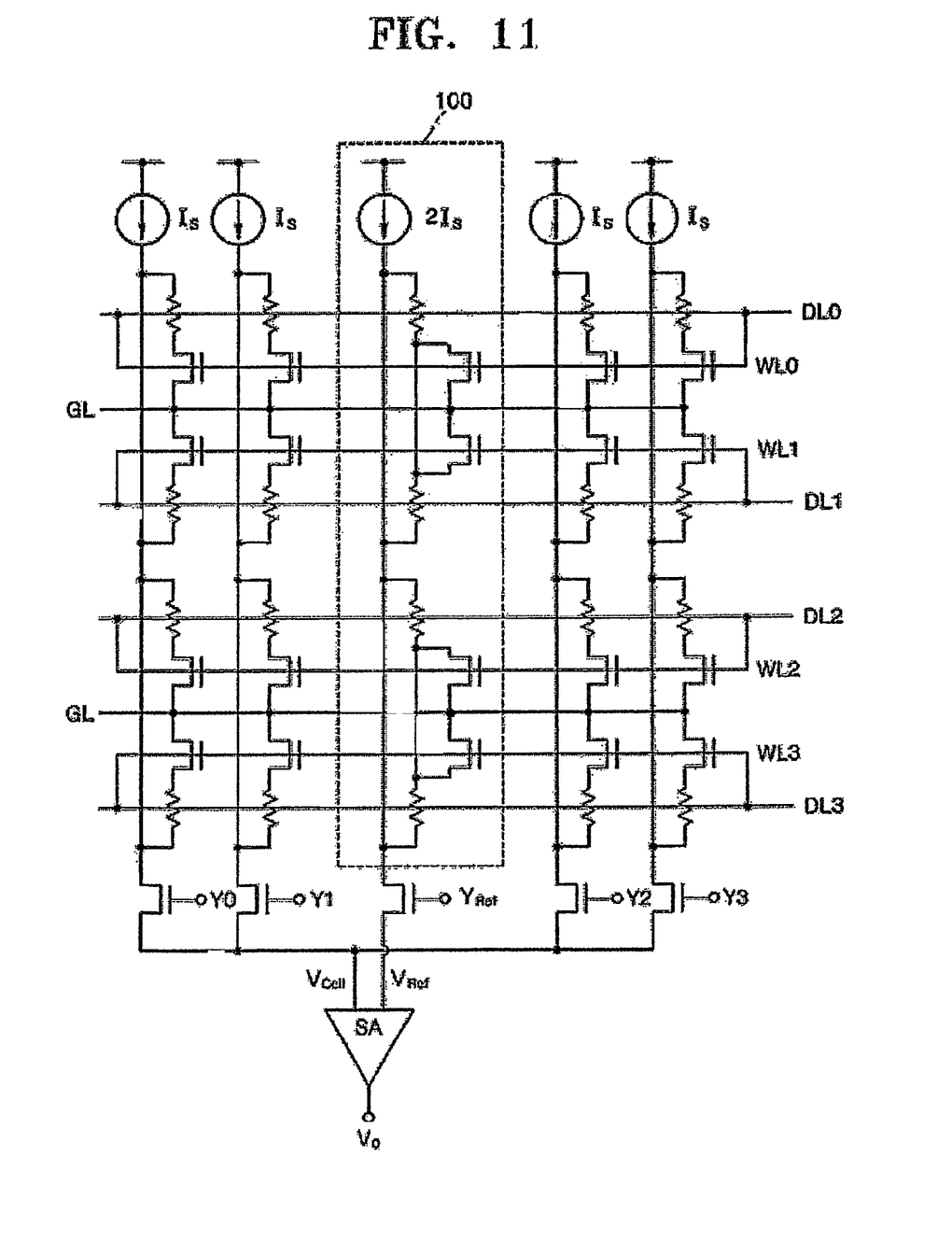
FIG. 11 is a circuit diagram of an array of a memory cell and a reference cell of an MRAM according to an embodiment of the present invention.
Figure 12:
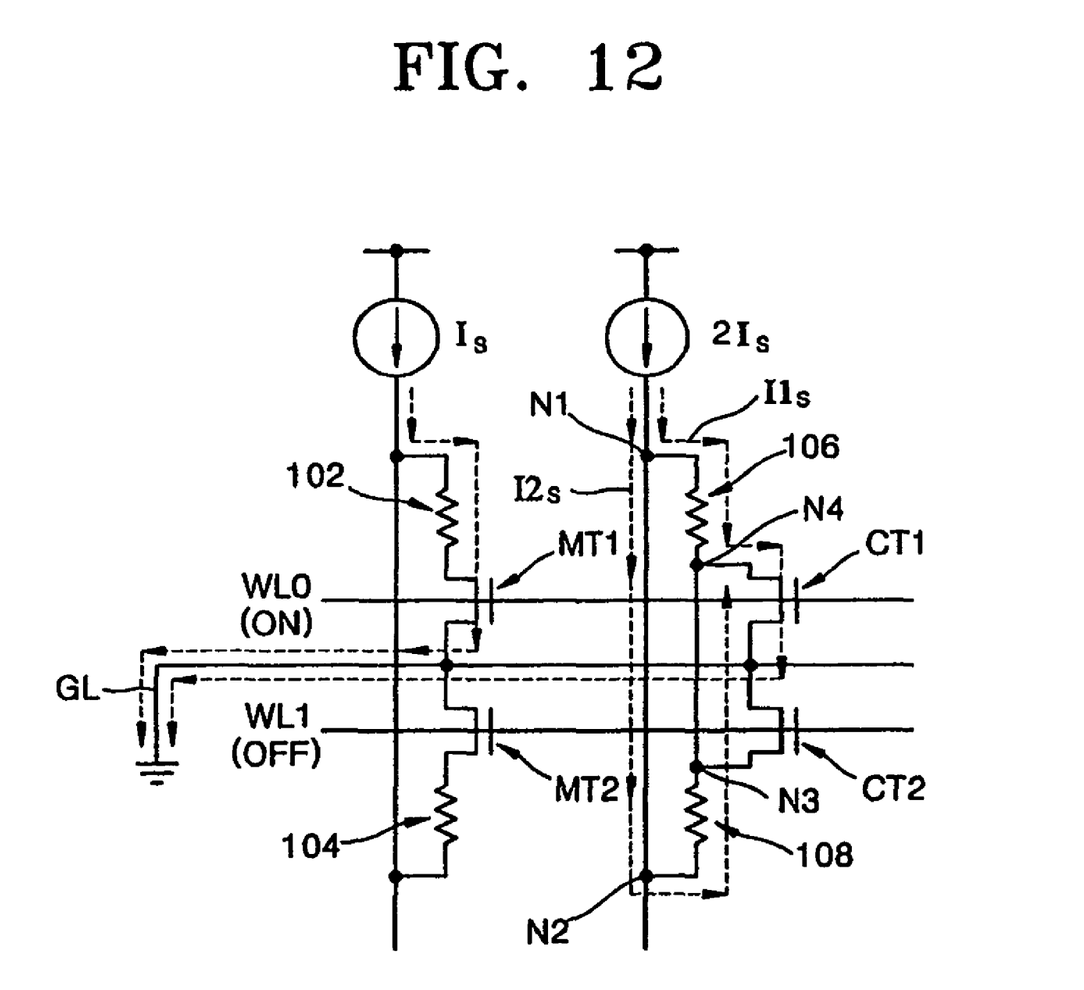
FIG. 12 is a circuit diagram showing the flow of a current applied to a memory cell and a reference cell corresponding to the memory cell in the memory cell array of FIG. 11.

FIG. 11 is a circuit diagram of an array of a memory cell and a reference cell of an MRAM according to an embodiment of the present invention. FIG. 12 is a circuit diagram showing the flow of a current applied to a memory cell and a reference cell corresponding to the memory cell in a memory cell array of FIG. 11.

FIG. 11 shows a cell array of an MRAM including the above-described alternative reference cell and memory cell. In FIG. 11, a reference cell column 100 includes a plurality of alternative reference cells. One reference cell column 100 is disposed in each memory cell block. A current $2\,I_s$, which corresponds to twice a current $I_s$ applied to a memory cell column, is applied to the reference cell column 100. One column of a memory cell block is selected by column select transistors Y0, Y1, Y2, and Y3 disposed under the cell array and is compared with the reference cell column 100. A digit line DL is used in recording data in an MTJ layer of the memory cell. When a current is applied to the digit line DL, a ground line GL is floated so that a current does not flow through a pass transistor connected to the MTJ layer.

FIG. 12 shows a path through which a current applied to a corresponding memory cell and the reference cell column 100 flows, so as to read data stored in a memory cell connected to a predetermined selected word line, e.g., a first word line WL0, of the MRAM array of FIG. 11. In FIG. 12, a left circuit is a memory cell of a memory cell column to which a read current $I_s$ is applied and which is connected to the first word line WL0, and a right circuit is the alternative reference cell of the reference cell column 100 to which a current $2\,I_s$ corresponding to twice the read current $I_s$ is applied and which is connected to the first word line WL0.

Referring to FIG. 12, since word lines other than the first word line WL0 are in an "off" state, the read current $I_s$ applied to the memory cell connected to the first word line WL0 passes through an MTJ layer 102 of the memory cell and a transistor MT1 connected in series to the MTJ layer 102 and flows through a ground line GL connected to the transistor MT1. The current $2\,I_s$ applied to the reference cell column 100 is divided into two at a first node N1 so that first and second currents $I1_s$ and $I2_s$ are applied to two parallel-connected MTJ layers 106 and 108. The first and second currents $I1_s$ and $I2_s$ have the same value. The first current $I1_s$ applied to the MTJ layer 106 connected to a transistor CT1 flows through the ground line GL via the transistor CT1 in an "on" state. The second current $I2_s$ passes through a second node N2, an MTJ layer 108 connected in series to a transistor CT2 in an off state connected to a second word line WL1, a third node N3, which is a connection point between the transistor CT2 and the MTJ layer 108, a fourth node N4, which is a connection point between the transistor CT1 and the MTJ layer 106, and the transistor CT1 connected to the first word line WL0 and flows through the ground line GL.

Since the current applied to the alternative reference cell passes through the two MTJ layers 106 and 108 that are connected in parallel to each other and then the transistor CT1, the driving capability of the transistor CT1 of the alternative reference cell may be twice the driving capability of a transistor MT1 of the memory cell.

As illustrated in FIG. 12, a transistor of the memory cell MT2 and a transistor of the reference cell CT2 according to the alternative embodiment are connected to the second word line WL1. An MTJ layer 104 of the memory cell is connected to the second word line WL1.

Since in the reference cell of FIG. 8 the current $2\,I_s$ is divide at the node so a first current flows to a ground line via the first MTJ layer 50 and the first transistor 54, and a second current flows to the ground line via the second MTJ layer 52 and the second transistor 56 after being divided at the node, the first and second currents in the reference cell of FIG. 8 correspond to the currents $I1_s$ and $I2_s$ of FIG. 12. This is because the current $I1s$ flows to the ground line GL via the MTJ 106 and the transistor CT1 after being divided at the node N1, and current $I2s$ flows to the ground line GL via the MTJ 108 and the transistor CT1 after being divided at the node N1. When WL1 is in an ON state and WL0 is in an OFF state, the currents $I1_s$ and $I2_s$ can flow via CT2 instead of CT1. Since each of the currents $I1_s$ and $I2_s$ flows to a ground line via a single MTJ and a single transistor after being divided at a node, the reference cells of FIGS. 8 and 12 are substantially the same. Therefore, an equivalent resistance of the reference cell of in FIG. 12 may be substantially the same as the equivalent resistance of the reference cell of FIG. 8, i.e., the middle value (RH+RL)/2.

In other words, a current supplied to the reference cell shown in FIG. 12 may have a substantially same value as the current supplied to the reference cell shown in FIG. 8. A current divided at a node of the reference cell shown in FIG. 8 flows to a ground line via one MTJ 50 (or 52) and one transistor 54 (or 56). Also, a current divided at the node N1 of the reference cell shown in FIG. 12 flows to the ground line GL via one MTJ 106 (or 108) and one transistor CT1 (or CT2). That is, the current and the current path in the reference cell shown in FIG. 12 are respectively the same as those in the reference cell shown in FIG. 8. As a result, operating conditions of the reference cell shown in FIG. 12 are the same as those of the reference cell shown in FIG. 8. Therefore, the equivalent resistance of the reference cell shown in FIG. 12 would be the same as that of the reference cell shown in FIG. 8 and maintained at the middle value (RH+RL)/2 even if an applied voltage varies.

As described above, the reference cell of the MRAM according to the present invention includes an MTJ layer having a maximum resistance of an MTJ layer of a memory cell and an MTJ layer having a minimum resistance of an MTJ layer of the memory cell, which are connected in parallel to each other, and two pass transistors connected in series to each MTJ layer and having the same driving capability as the driving capability of a pass transistor of the memory cell. In this case, the two pass transistors of the reference cell may be substituted for one pass transistor having a driving capability corresponding to twice a driving capability of the pass transistor of the memory cell. In the case of an MRAM according to an embodiment of the present invention, the same current as the current applied to the MTJ layer of the memory cell is applied to each MTJ layer of the reference cell. Thus, the equivalent resistance measured in the reference cell is a middle value between the maximum resistance and the minimum resistance measured in the memory cell. In addition, a voltage $V_{Ref}$ measured in the reference cell has a middle value between a maximum voltage $V_{Cell},H$ and a minimum voltage $V_{Cell},L$ measured in the memory cell even though the applied voltage varies. Thus, in the case of the MRAM according to the present invention, a sufficient sensing margin can be obtained, and malfunction caused by noise can be prevented.

Exemplary embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

what is claimed is:

1. A magnetic random access memory (MRAM), comprising:
    a memory cell having a first transistor and a first magnetic tunneling junction (MTJ) layer; and
    a reference cell operable as a basis when reading data stored in the memory cell, the reference cell including second and third MTJ layers arranged in parallel to each other, and second and third transistors, the second and third MTJ layers connected in series to each of the second and third transistors, the second transistor having a driving capability corresponding to twice a driving capability of the first transistor of the memory cell.

2. The MRAM as claimed in claim 1, wherein one of the second and third MTJ layers of the reference cell has a maximum resistance of the first MTJ layer of the memory cell, and the other of the second and third MTJ layers of the reference cell has a minimum resistance of the first MTJ layer of the memory cell.

3. A method of reading data from the magnetic random access memory (MRAM) of claim 1, the method comprising:
    applying a read current $I_s$ to the memory cell; and
    applying a current $2I_s$ to the reference cell, the current $2I_s$ corresponding to twice the read current $I_s$.

4. The method as claimed in claim 3, wherein one of the second and third MTJ layers has a maximum resistance of the first MTJ layer of the memory cell, and the other of the second and third MTJ layers has a minimum resistance of the first MTJ layer of the memory cell.

5. The MRAM as claimed in claim 1, wherein the third transistor has a driving capability corresponding to twice a driving capability of the first transistor of the memory cell.

6. The MRAM as claimed in claim 1, wherein the second and third transistors are sequentially connected to an end of the second MTJ layer, and the third and second transistors are sequentially connected to an end of the third MTJ layer, and
    the end of the second MTJ layer and the end of the third MTJ layer are connected to each other via a connecting wire.

7. The MRAM as claimed in claim 1, wherein the MRAM is configured such that one of the second and third transistors is turned on when reading data stored in the memory cell.

8. The MRAM as claimed in claim 1, wherein the second and third transistors are connected to first and second word lines, respectively.

9. The MRAM as claimed in claim 8, wherein the first word line is connected to the first transistor.

10. The MRAM as claimed in claim 8, further comprising a second memory cell including a fourth transistor and a fourth MTJ layer,
    wherein the second word line is connected to the fourth transistor.

11. The MRAM as claimed in claim 1, wherein the second and third transistors are connected to a ground line.

12. A magnetic random access memory (MRAM), comprising:
    a memory cell including a first transistor and a first magnetic tunneling junction (MTJ) layer; and
    a reference cell operable as a basis when reading data stored in the memory cell, the reference cell including second and third MTJ layers arranged in parallel to each other, and
    second and third transistors, the second and third MTJ layers connected in series to each of the second and third transistors, a driving capability of the second transistor corresponding to twice a driving capability of the first transistor of the memory cell,
    wherein the first transistor, the second transistor and the third transistor are commonly connected to a ground line, and
    the first transistor and one of the second and third transistors are commonly connected to a word line.

* * * * *